(12) United States Patent
Yam et al.

(10) Patent No.: US 10,962,590 B2
(45) Date of Patent: Mar. 30, 2021

(54) MAGNET MOUNTING APPARATUS FOR MTJ DEVICE TESTERS

(71) Applicant: SPIN MEMORY, Inc., Fremont, CA (US)

(72) Inventors: Danny Yam, Fremont, CA (US); Jorge Vasquez, Fremont, CA (US); Roberto Cordero, Fremont, CA (US); Georg Wolf, Fremont, CA (US)

(73) Assignee: Spin Memory, Inc., Fremont, CA (US)

( * ) Notice: Subject to any disclaimer, the term of this patent is extended or adjusted under 35 U.S.C. 154(b) by 480 days.

(21) Appl. No.: 15/855,799

(22) Filed: Dec. 27, 2017

(65) Prior Publication Data

US 2019/0195944 A1 Jun. 27, 2019

(51) Int. Cl.
*G01R 31/28* (2006.01)
*G11C 29/56* (2006.01)
*G11C 11/16* (2006.01)
*G11C 29/00* (2006.01)

(52) U.S. Cl.
CPC .... *G01R 31/2887* (2013.01); *G11C 29/56016* (2013.01); *G11C 11/161* (2013.01); *G11C 29/006* (2013.01); *G11C 2029/5602* (2013.01)

(58) Field of Classification Search
CPC .. G01R 31/2887; G11C 11/161; G11C 29/006
See application file for complete search history.

(56) References Cited

U.S. PATENT DOCUMENTS

| | | | | |
|---|---|---|---|---|
| 6,359,453 | B1* | 3/2002 | Forbis | G01R 31/2887 324/529 |
| 7,250,757 | B1* | 7/2007 | Tiernan | G01N 27/9046 324/228 |
| 7,330,025 | B1* | 2/2008 | Beach | G01R 31/2893 324/762.02 |
| 2005/0012515 | A1* | 1/2005 | Kim | G01R 31/2886 324/754.03 |
| 2006/0156850 | A1* | 7/2006 | Mueller | B23Q 1/26 74/490.01 |
| 2010/0170086 | A1* | 7/2010 | Ramadan | H01L 21/6835 29/834 |
| 2014/0139209 | A1* | 5/2014 | Lee | G11C 29/56016 324/211 |
| 2015/0260804 | A1* | 9/2015 | Kishi | G01R 33/1207 324/210 |
| 2017/0059669 | A1* | 3/2017 | Kan | G01R 33/1207 |

* cited by examiner

*Primary Examiner* — Jermele M Hollington
*Assistant Examiner* — Temilade S Rhodes-Vivour

(57) ABSTRACT

A magnet mounting apparatus including a cage, a magnet carriage and first actuator for use in testing Magnetic Tunnel Junction (MTJ) devices. The cage can be configured for mounting to an Automated Test Equipment (ATE). The magnet carriage can be configured for coupling to a wafer test magnet. The first actuator can be coupled between the cage and the magnet carriage. The first actuator can be configured to move the magnet carriage between a first position and a second position along a z-axis. The first position can be configured for locating the wafer test magnet within a predetermined proximity to a Device Under Test (DUT) wafer, and the second position can be configured for replacing a probe card.

18 Claims, 4 Drawing Sheets

MAGNET MOUNTING APPARATUS FOR MTJ DEVICE TESTERS

BACKGROUND OF THE INVENTION

Computing systems have made significant contributions toward the advancement of modern society and are utilized in a number of applications to achieve advantageous results. Numerous devices, such as desktop personal computers (PCs), laptop PCs, tablet PCs, netbooks, smart phones, servers, and the like have facilitated increased productivity and reduced costs in communicating and analyzing data in most areas of entertainment, education, business, and science. One common aspect of computing systems is the memory subsystem that is used to store data. Computing systems may include one or more types of memory, such as volatile random-access memory, non-volatile flash memory, and the like.

An emerging non-volatile memory technology is Magnetoresistive Random Access Memory (MRAM). In MRAM devices, data can be stored in the magnetization orientation between ferromagnetic layers. Typically, if the ferromagnetic layers have the same magnetization polarization, the cell will exhibit a relatively low resistance value corresponding to a '1' bit state; while if the magnetization polarization between the two ferromagnetic layers is antiparallel the memory cell will exhibit a relatively high resistance value corresponding to a '0' bit state. Because the data is stored in the magnetic fields, MRAM devices are non-volatile memory devices. MRAM devices are characterized by densities similar to Dynamic Random-Access Memory (DRAM), power consumption similar to flash memory, and speed similar to Static Random-Access Memory (SRAM).

MRAM devices typically employ an array of Magnetic Tunnel Junctions (MTJs). The MTJs can include two ferromagnetic layers separate by a thin insulator layer. Electrons can tunnel from one ferromagnetic layer into the other. However, the orientation of the magnetization on the ferromagnetic layers affects the rate of electron tunneling such that the junction can be switched between a low resistance state and a high resistance state.

When testing MTJ devices, a probe card can be coupled to the MTJ devices on a wafer for sending and receiving signals for testing features of the MTJ devices. The probe card can include a plurality of contacts, pins or the like for making electrical connection between an Automatic Test Equipment (ATE) and wafers under test. The contacts, pins or other electrical connections on the probe card typically wear out over time and therefore the probe card may need to be replaced periodically. In addition, when different devices are tested on an ATE, a different probe card may be needed for the different devices. When testing MTJ devices, a magnet is typically placed over the wafer to induce a magnetic field in the MTJ devices. The applied magnetic field can be used to test features of the MTJ device. The control of the applied magnetic field is important to the reporting of accurate and reproducible test result. However, the magnet may interfere with replacement of the probe card, which can slow down production testing of wafers. The magnet may also need to be realigned with the wafer after each time the probe card is replaced to provide for accurate test results, which can also slow down production testing of wafers. Accordingly, there is a continuing need for improved test devices, systems and methods for use with MTJ devices.

SUMMARY OF THE INVENTION

The present technology may best be understood by referring to the following description and accompanying drawings that are used to illustrate embodiments of the present technology directed toward a magnet mounting apparatus for Magnetic Tunnel Junction (MTJ) device testers, and testers for other similar magnetic devices fabricated on wafers.

In one embodiment, a magnet mounting apparatus can include a first and a second frame element. The first frame element can be configured for mounting to a device test fixture. The second frame element can be coupled to a wafer test magnet. A first actuator can be coupled between the first frame element and the second frame element. The first actuator in combination with a controller can be configured to move the second frame element, and the wafer test magnet coupled thereto, between a first position and a second position. The first position can be a predetermined distance from a Device Under Test (DUT) wafer for use in testing the DUT wafer. The second position can be for changing a probe card. The magnet mounting apparatus can optionally include one or more additional actuators configured to further adjust a position of the wafer test magnet in the first position along one or more axis locate the wafer test magnet within the predetermined distance from the DUT wafer. In one implementation, the first actuator can be a pneumatic cylinder and the optional additional actuators can include one or more stepper motors. Alternatively, the first actuator can be a servo motor, a magnetic linear motor, non-motorized linear motion rails or the like. The pneumatic cylinder can be configured to move the wafer test magnet relatively quickly between the first and second position, with a relatively high degree of repeatability for returning to the first position. The one or more stepper motors can be configured to adjust first position of the wafer test magnet along one or more of the x, y and/or z axes to locate the wafer test magnet within the predetermined distance from the DUT wafer.

In another embodiment, the method of testing Magnetic Tunnel Junction (MTJ) devices wafers can include moving a wafer test magnet coupled to a carriage into a first position for testing a DUT wafer. The wafer test magnet can be moved using a first actuator coupled between the carriage and a cage coupled to the test fixture. When a probe card needs to be replaced, the wafer test magnet can be moved to a second position using the first actuator coupled between the carriage and a cage. The probe card can then be replaced while the wafer test magnet is in the second position. The wafer test magnet can be moved back into the first position for testing another DUT wafer, after replacing the probe card.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

Embodiments of the present technology are illustrated by way of example and not by way of limitation, in the figures of the accompanying drawings and in which like reference numerals refer to similar elements and in which.

DETAILED DESCRIPTION OF THE INVENTION

Figure 1A:
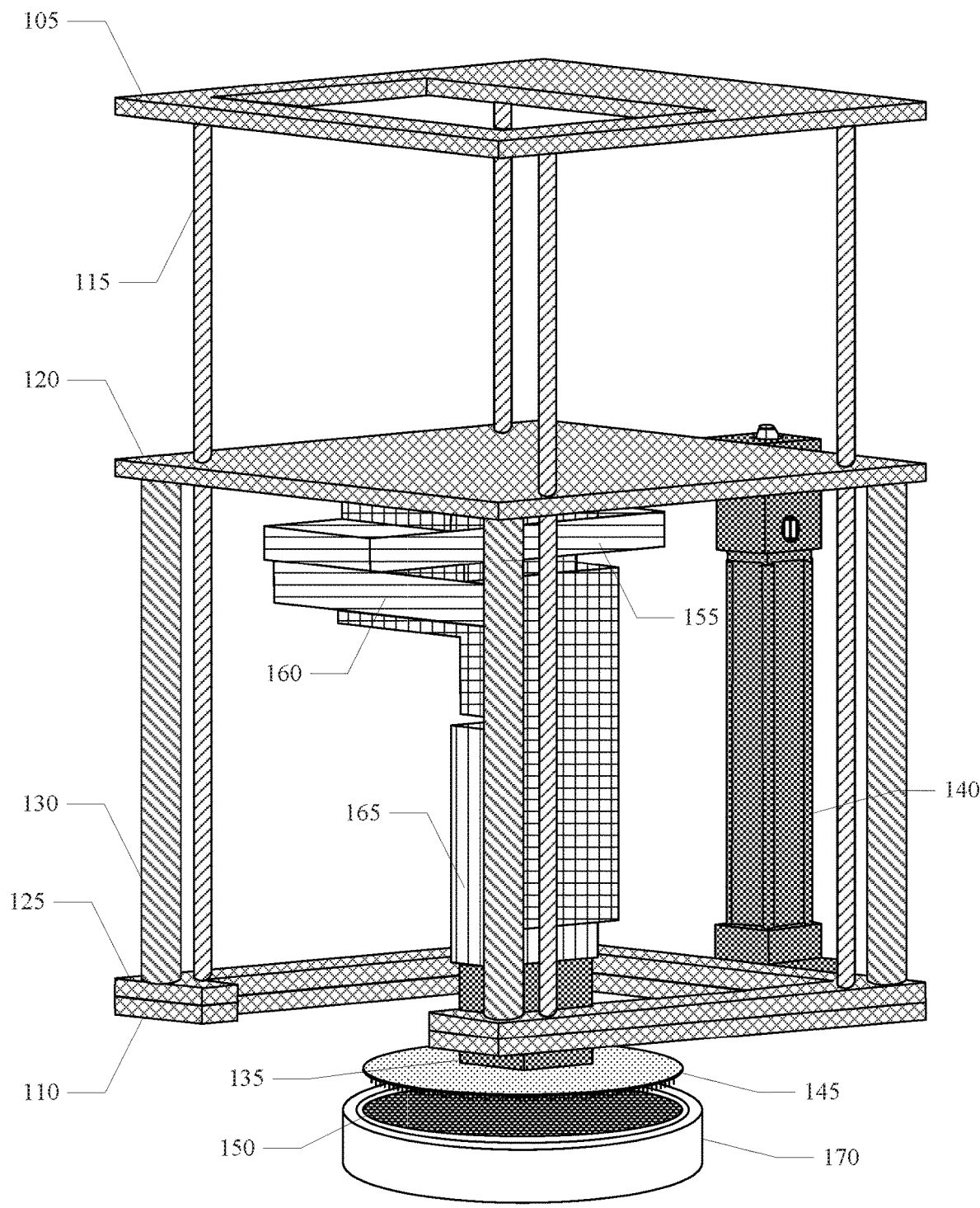
FIGS. 1A and 1B show a magnet mounting apparatus for use with a Magnetic Tunnel Junction (MTJ) device test fixture, in accordance with embodiments of the present technology.

Reference will now be made in detail to the embodiments of the present technology, examples of which are illustrated in the accompanying drawings. While the present technology will be described in conjunction with these embodiments, it will be understood that they are not intended to limit the invention to these embodiments. On the contrary, the invention is intended to cover alternatives, modifications and equivalents, which may be included within the scope of the invention as defined by the appended claims. Furthermore, in the following detailed description of the present technology, numerous specific details are set forth in order to provide a thorough understanding of the present technology. However, it is understood that the present technology may be practiced without these specific details. In other instances, well-known methods, procedures, components, and circuits have not been described in detail as not to unnecessarily obscure aspects of the present technology.

Some embodiments of the present technology which follow are presented in terms of routines, modules, logic blocks, and other symbolic representations of operations on data within one or more electronic devices. The descriptions and representations are the means used by those skilled in the art to most effectively convey the substance of their work to others skilled in the art. A routine, module, logic block and/or the like, is herein, and generally, conceived to be a self-consistent sequence of processes or instructions leading to a desired result. The processes are those including physical manipulations of physical quantities. Usually, though not necessarily, these physical manipulations take the form of electric or magnetic signals capable of being stored, transferred, compared and otherwise manipulated in an electronic device. For reasons of convenience, and with reference to common usage, these signals are referred to as data, bits, values, elements, symbols, characters, terms, numbers, strings, and/or the like with reference to embodiments of the present technology.

It should be borne in mind, however, that all of these terms are to be interpreted as referencing physical manipulations and quantities and are merely convenient labels and are to be interpreted further in view of terms commonly used in the art. Unless specifically stated otherwise as apparent from the following discussion, it is understood that through discussions of the present technology, discussions utilizing the terms such as "receiving," and/or the like, refer to the actions and processes of an electronic device such as an electronic computing device that manipulates and transforms data. The data is represented as physical (e.g., electronic) quantities within the electronic device's logic circuits, registers, memories and/or the like, and is transformed into other data similarly represented as physical quantities within the electronic device.

In this application, the use of the disjunctive is intended to include the conjunctive. The use of definite or indefinite articles is not intended to indicate cardinality. In particular, a reference to "the" object or "a" object is intended to denote also one of a possible plurality of such objects. It is also to be understood that the phraseology and terminology used herein is for the purpose of description and should not be regarded as limiting.

Figure 1B:
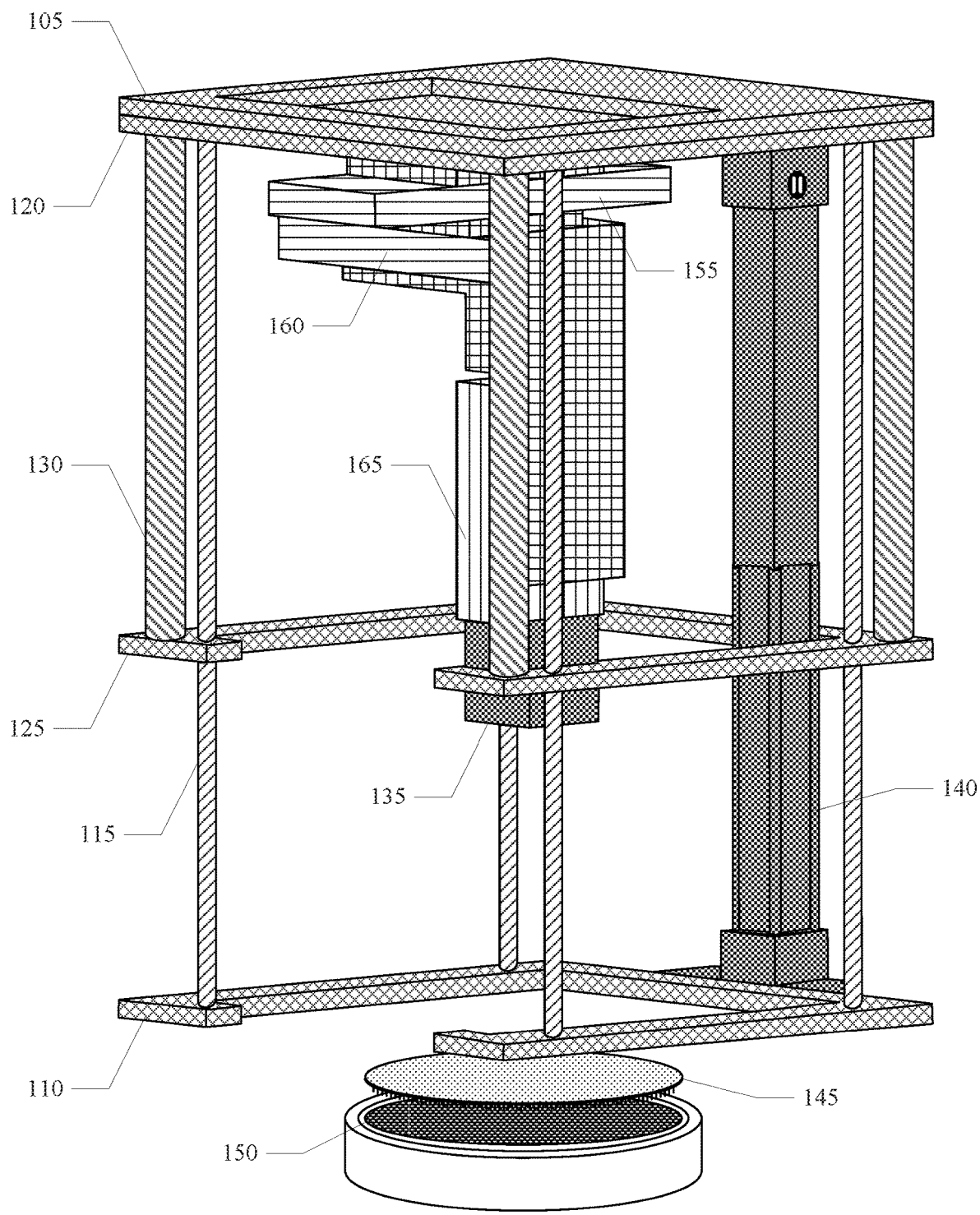

Referring to FIGS. 1A and 1B, a magnet mounting apparatus for use with a Magnetic Tunnel Junction (MTJ) device test fixture, in accordance with embodiments of the present technology, is shown. The test fixture may be an Automatic Test Equipment (ATE) used for testing wafers containing a plurality of MTJ devices. The magnet mounting apparatus can be configured for positioning a wafer test magnet utilized in conjunction with the ATE to test features of the MTJ devices.

In one aspect, the magnet mounting apparatus can include a cage 105-115 configured for mounting to a test fixture, and a magnet carriage 120-130 configured for coupling to a wafer test magnet 135. The apparatus can further include a first actuator 140 coupled between the cage 105-115 and the magnet carriage 120-130. The first actuator 140 can be configured to move the magnet carriage 120-130 between a first position, as illustrated in FIG. 1A, and a second position, as illustrated in FIG. 1B. The first position can be configured for locating the wafer test magnet 135 within a predetermined distance from a Device Under Test (DUT) wafer 150. The second position can be configured for replacing a probe card 145.

In one aspect, the cage can include a top cage frame 105, a base cage frame 110, and a set of guide rods 115 fixedly coupled between the top cage frame 105 and the base cage frame 110. The carriage can include a top carriage frame 120, a bottom carriage frame 125, and a set of spacers 130 fixedly coupled between the top carriage frame 120 and the bottom carriage frame 125. The top carriage frame 120 can be configured for coupling to the wafer test magnet 135. The first actuator 140 can be coupled between the top carriage frame 120 and the based cage frame 110. The magnet carriage 120-130 can be movably coupled to the set of guide rods 115 of the cage 105-115. The set of guide rods 115 can be configured to guide the magnet frame 120-130 between the first position and the second position as the first actuator 140 moves the magnet carriage 120-130 between the first and second positions. The carriage frame 120-130 therefore holds the wafer test magnet 135 and thereby shifts the wafer test magnet 135 between the first position, configure for using the wafer test magnet 135 when testing DUT wafers 150, and the second position, configured for replacing a probe card 145. With the wafer test magnet 130 in the second position, the probe card 145 can be quickly and easily replaced when the contact on the probe card 145 wear out, or when a different probe card 145 is needed for testing DUT wafers 150 of a different architecture.

In one aspect, the magnet mounting apparatus can further include a second and third actuator 155, 160 coupled to the magnet carriage 120-130. The second actuator 155 can be configured to control displacement of the wafer test magnet 135 along an x-axis. The third actuator 160 can be configured to control displacement of the wafer test magnet 135 along a y-axis. The magnet mounting apparatus can also include a fourth actuator 165 coupled to the magnet carriage 120-130 that is configured to further control a displacement of the wafer test magnet 135 along the z-axis. In one implementation, the first actuator 140 can be a pneumatic cylinder, and the optional second, third and fourth actuators 155-165 can be stepper motors. The pneumatic cylinder 140 can be utilized to move the magnet frame carriage 120-130, and thereby the wafer test magnet 135, between the first position utilized for testing the DUT wafers 150 and the second position utilized for replacing the probe card 145.

The stepper motors can be utilized to adjust the displacement of the wafer test magnet 135 relative to a fixed position of a wafer chuck 170. The stepper motors can adjust the displacement along the x, y and z axis of the wafer test magnet 135 to register the location of the wafer test magnet 135 with a location of the chuck 170 within a predetermined degree of accuracy. The pneumatic cylinder can advantageously move the magnet carriage 120-130 quickly over large distances, relative to the stepper motors. The first actuator 140 in other implementations can be a servo motor, a magnetic linear motor, non-motorized linear motion rails or the like for similarly moving the magnet frame carriage 120-103, and thereby the wafer test magnet 135, between the first position utilized for testing the DUT wafers 150 and the second position utilized for replacing the probe card 145.

The magnet mounting apparatus of FIGS. 1A and 1B can also be configured for use with other test fixtures for testing other magnetic devices fabricated on a wafer. The magnet mounting apparatus can also be utilized for testing Giant Magnetoresistance (GMR) sensors, Anisotropic Magnetoresistance (AMR) sensor, Hall Effect sensors, and the like for use in Hard Disk Drives (HDD), magnetic field sensors and the like.

Figure 2:
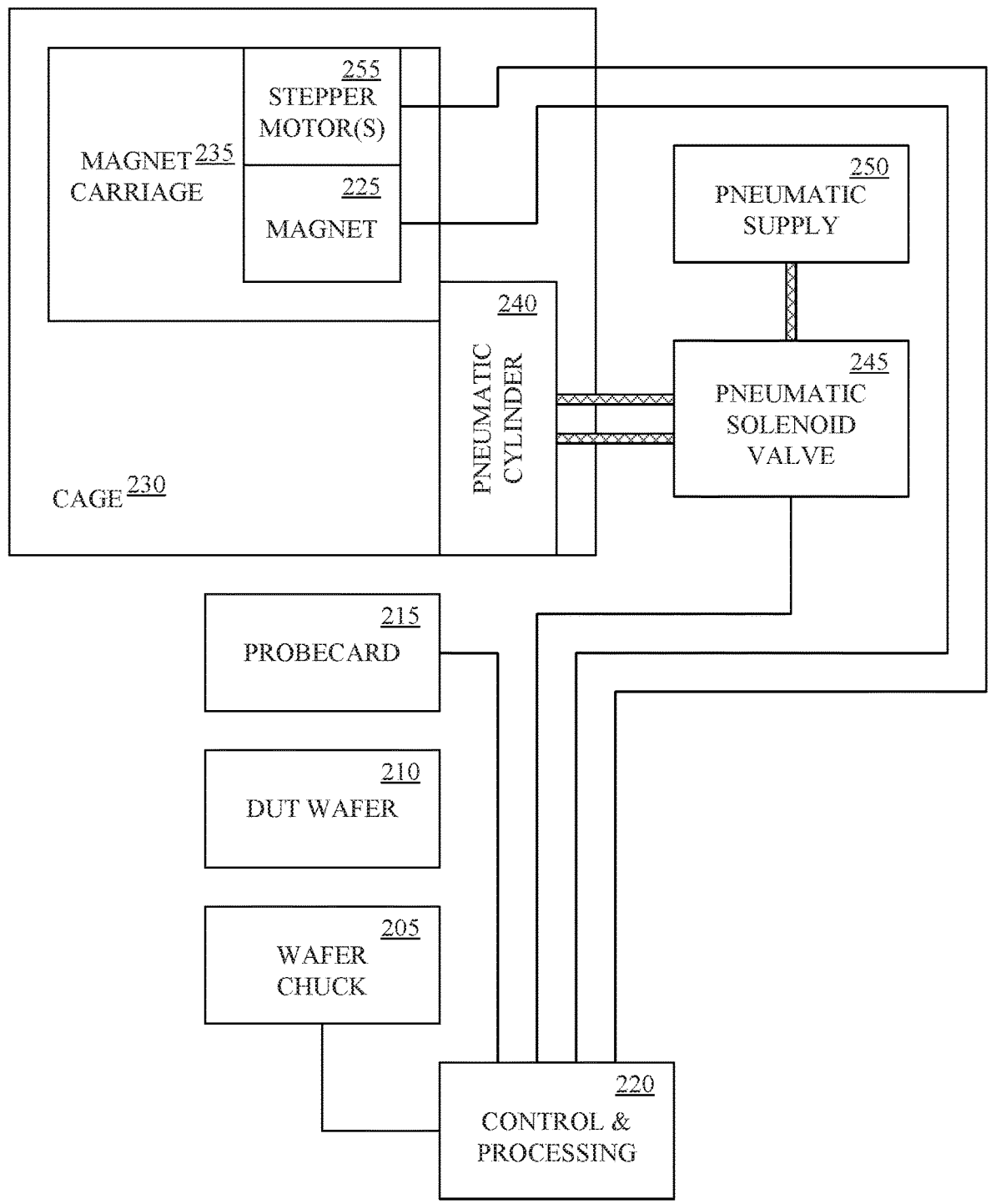
FIG. 2 shows block diagram of a magnet mounting apparatus for use with a MTJ device test fixture, in accordance with embodiments of the present technology.

Referring now to FIG. 2, a magnet mounting apparatus for use with a Magnetic Tunnel Junction (MTJ) device test fixture, in accordance with embodiments of the present technology, is shown. The test fixture can include a wafer chuck 205 for holding DUT wafers 210. The test fixture can also include a probe card 215 for making electrical connections between one or more control and/or processing units 220 of the test fixture. The contacts, pins or other electrical connections on the probe card 215 typically wear out over time and therefore the probe card 215 may need to be replace periodically. In addition, when DUT wafers 210 of different architectures are tested, different probe cards 215 may be needed for the different DUT wafers 310.

In one aspect, the test fixture can also include a wafer test magnet 225 and a magnet mounting apparatus 230-255. The magnet mounting apparatus can include a cage 230 configured for mounting in a fixed relation to the wafer chuck 205. Typically, the wafer chuck 205 can be in a fixed position relative to a piece of test fixture equipment and the cage 230 can be mounted to the piece of test fixture equipment such that the cage 230 is in a fixed position relative to the wafer chuck 205. The magnet mounting apparatus 230-255 can also include a magnet carriage 235 configured for coupling to the wafer test magnet 225. The magnet mounting apparatus 230-255 can further include a pneumatic cylinder 240, a pneumatic solenoid 245 and a pneumatic supply 250. The pneumatic cylinder 240, pneumatic solenoid 245 and pneumatic supply 250 can operate as an actuator in response to signal received from one or more control and/or processing units 220. The pneumatic cylinder 240 can be coupled between the cage 230 and the magnet carriage 235. The pneumatic cylinder can be configured to move the magnet carriage 230 between a first and second position. In one instance, the pneumatic solenoid 245, in response to a first signal from the one or more control and/or processing units 220, may direction air from the pneumatic supply 250 in a first direction to cause the pneumatic cylinder 240 to extend and thereby move the magnet carriage 235 into the second position used for replacing the probe card 215. The pneumatic solenoid 245, in response to a second signal, may direct air from the pneumatic supply 250 in a second direction through the pneumatic cylinder 240 to cause the pneumatic cylinder to retract and thereby move the magnet carriage 235 into the first position used for testing the DUT wafers using the wafer test magnet 225. In another instance, the pneumatic solenoid 245 can be replaced with a user operable switch. In such case, a user can manually extend or retract the pneumatic cylinder 240 for the purpose of replacing the probe card 215 and testing of the DUT wafers 210 respectively.

In one aspect, the magnet mounting apparatus can optionally include one or more stepper motors 255. The stepper motors 255 can be configured to control the displacement of the wafer test magnet 225 in response to one or more signals received from the one or more control and/or processing units 220. The stepper motors 255 can adjust the displacement along the x, y and z axis of the wafer test magnet 225 to register the location of the wafer test magnet 225 with a location of the DUT wafer 210 in the chuck 205 within a predetermined degree of accuracy. The functions performed by the one or more control and/or processing units 220 can be implemented as computing device-executable instructions (e.g., computer program) that are stored in computing device-readable media (e.g., computer memory) and executed by a computing device (e.g., processor).

In one embodiment, the test fixture comprises an ATE for testing wafers containing a plurality of MTJ devices. The magnet mounting apparatus provides for moving the wafer test magnet 225 between a first position, used for testing the MTJ DUT wafers 205, and a second position, used for replacing probe cards 215. The pneumatic cylinder 240 of the magnet mounting apparatus can advantageously move the magnet carriage 235 quickly over large distances, relative to the stepper motors 255. Furthermore, the pneumatic cylinder 240 can advantageously return to the first position used for testing the DUT wafer 205 with a high degree of repeatability.

Again, the magnet mounting apparatus can also be configured for use with other test fixtures for testing other magnetic devices fabricated on a wafer. The magnet mounting apparatus can also be utilized for testing Giant Magnetoresistance (GMR) sensors, Anisotropic Magnetoresistance (AMR) sensor, Hall Effect sensors, and the like for use in Hard Disk Drives (HDD), magnetic field sensors and the like.

Figure 3:
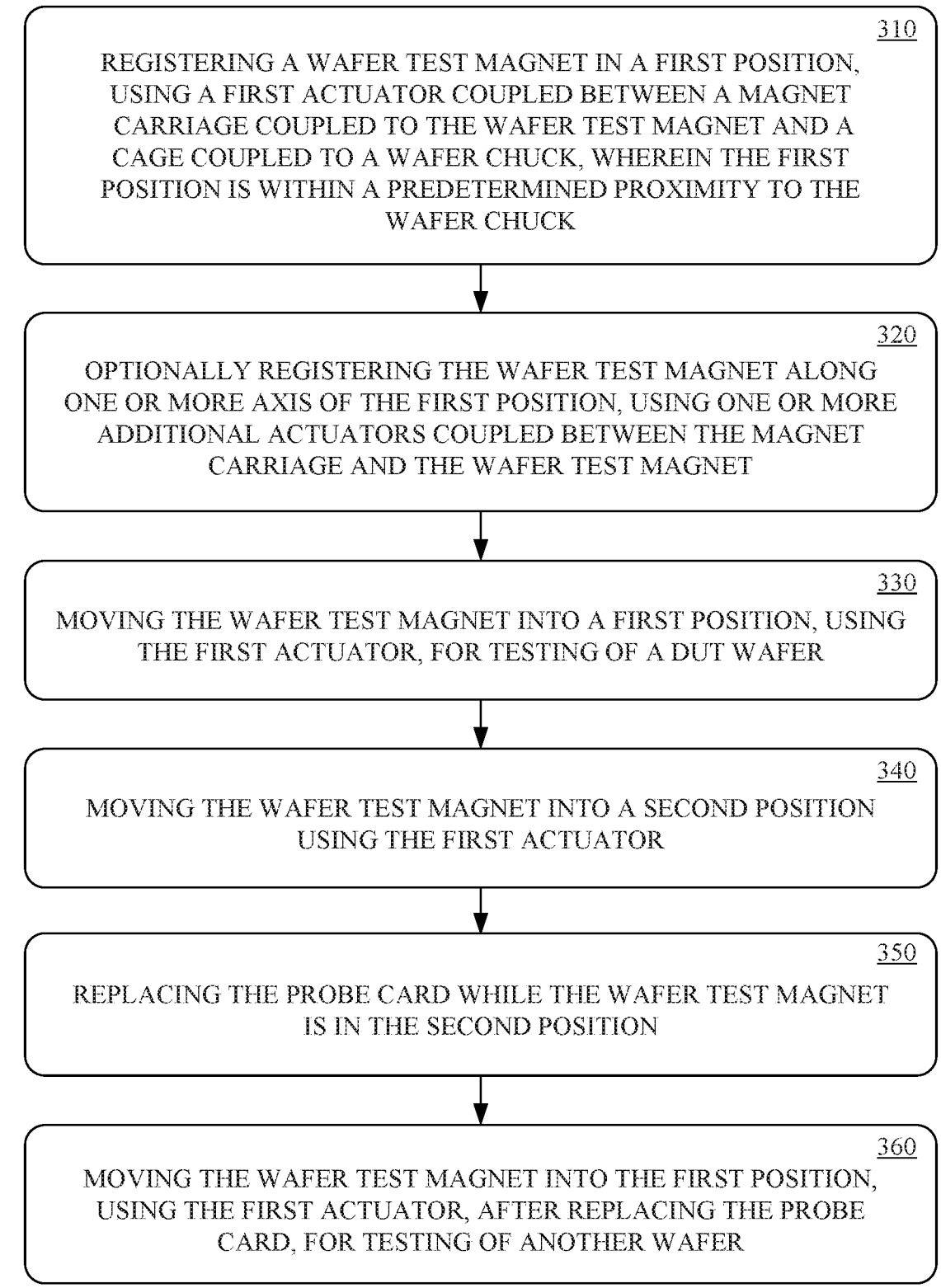
FIG. 3 shows a flow diagram of using a magnet mounting apparatus of a MTJ device test fixture, in accordance with embodiments of the present technology.

Referring now to FIG. 3, a flow diagram of using a magnet mounting apparatus of a MTJ device test fixture, in accordance with embodiments of the present technology, is shown. The method may be implemented as computing device-executable instructions (e.g., computer program) that are stored in computing device-readable media (e.g., computer memory) and executed by a computing device (e.g., processor). Testing of MTJ DUTs using the MTJ device test fixture 500 can include a setup phase 310, 320 and a testing phase 330-360.

In the setup phase, the wafer test magnet can be registered in a first position that is within a predetermined proximity to a wafer chuck, at 310. In one implementation, the wafer test magnet can be coupled to a magnet carriage, and a cage can be coupled to the wafer chuck. A first actuator coupled between the magnet carriage and the cage can be used for registering the wafer test magnet with the wafer chuck. The first actuator can be a pneumatic cylinder coupled between a top carriage frame and a bottom cage frame. Alternatively, the first actuator can be a servo motor, a magnetic linear motor, non-motorized linear motion rails or the like for similarly moving the top carriage frame and the cage, and thereby the wafer test magnet.

Optionally, one or more additional actuators can be utilized to further register the wafer test magnet along one or more axis of the first position, at 320. In one implementation, a first, second and third stepper motors can be configured to adjust the position of the wafer test magnet along the x, y and z axis to within the predetermined proximity of the wafer chuck.

In the testing phase, the wafer test magnet can be moved into the first position for testing DUT wafers, 330. In one implementation, the first actuator coupled between the magnet carriage and the cage can be used to move the wafer test magnet to the first position. During testing DUT wafers, contacts on a probe card may wear out. As a result, the probe card may need to be replaced. Alternatively, a different probe card may be needed if the DUT wafers change. When the probe card needs to be changed, the wafer test magnet can be moved to a second position, at 340. In one implementation, the first actuator coupled between the magnet carriage and the cage can be used to move the wafer test magnet to the second position. The second position can be a location where the wafer test magnet is up out of the way of the probe card. At 350, the probe card can then be replaced while the wafer test magnet is in the second position. The second position can provide for easy access for replacing the probe card with a new probe card or a different probe card. After the probe card is replaced, the wafer test magnet can be moved back into the first position, at 360. In one implementation, the first actuator coupled between the magnet carriage and the cage can be used to move the wafer test magnet to the first position for testing of additional DUT wafers. If a probe card for testing DUT wafers of a first architecture is replaced with a probe card for testing DUT wafers of a second architecture, the processes of 310-330 may be performed after replacement of the probe card in process 350.

In one embodiment, the test method may utilize the wafer test magnet for testing function of MTJ devices fabricated on the DUT wafers. The method provides for moving the wafer test magnet between a first position, used for testing the MTJ DUT wafers, and a second position, used for replacing probe cards. The pneumatic cylinder can advantageously move the magnet carriage quickly over large distances, relative to the stepper motors. Furthermore, the pneumatic cylinder can advantageously return to the first position used for testing the DUT wafers with a high degree of repeatability. In other embodiments, the test method may utilize the wafer test magnet for testing function of other magnetic devices fabricated on a wafer such as Giant Magnetoresistance (GMR) sensors, Anisotropic Magnetoresistance (AMR) sensor, Hall Effect sensors, and the like.

The foregoing descriptions of specific embodiments of the present technology have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the present technology and its practical application, to thereby enable others skilled in the art to best utilize the present technology and various embodiments with various modifications as are suited to the particular use contemplated. It is intended that the scope of the invention be defined by the claims appended hereto and their equivalents.

What is claimed is:
1. A magnet mounting apparatus comprising:
a wafer test magnet;
a first frame element configured for mounting to an Automated Test Equipment (ATE);
a second frame element coupled to the wafer test magnet;
a pneumatic cylinder coupled between the first frame element and the second frame element, the pneumatic cylinder configured to move the wafer test magnet coupled to the second frame element between a first position and a second position, wherein the first position is a predetermined distance from a Device Under Test (DUT) wafer for use in testing of the DUT wafer and the second position for changing a probe card;
a third frame element; and
a set of fourth frame elements fixedly coupled between the first frame element and the third frame element, the set of fourth frame elements configured to guide the second frame element between the first position and the second position when the wafer test magnet coupled to the second frame element is moved by the pneumatic cylinder between the first position and the second position.

2. The magnet mounting apparatus of claim 1, further comprising:
a controller configured for actuating the pneumatic cylinder to move the wafer test magnet between the first position and the second position.

3. The magnet mounting apparatus of claim 2, wherein the controller is user operable.

4. The magnet mounting apparatus of claim 2, wherein the controller is operable by the ATE.

5. The magnet mounting apparatus of claim 1, further comprising:
one or more stepper motors coupled between the wafer test magnet and the second frame element, the one or more stepper motors configured to control displacement of the wafer test magnet along one or more axis.

6. The magnet mounting apparatus of claim 1, wherein the DUT wafer comprises a wafer of Magnetic Tunnel Junction (MTJ) devices.

7. A magnet mounting apparatus comprising:
a cage configured for mounting to a test fixture, the cage including a top cage frame, a base cage frame and a set of guide rods fixedly coupled between the base cage frame and the top cage frame;
a magnet carriage configured for coupling to a wafer test magnet;
a first actuator coupled between the cage and the magnet carriage, the first actuator configured to move the magnet carriage between a first position and a second position along a z-axis, the first position configured for locating the wafer test magnet within a predetermined proximity to a Device Under Test (DUT) wafer and the second position can be configured for replacing a probe card; and
wherein the magnet carriage is movably coupled to the set of guide rods and wherein the set of guide rods are configured to guide the magnet carriage between the first position and the second position.

8. The magnet mounting apparatus of claim 7, further comprising:
the magnet carriage including a top carriage frame, a bottom carriage frame, and a set of spacers fixedly coupled between the top carriage frame and the bottom carriage frame; and
wherein the first actuator is coupled between the top carriage frame and the base cage frame, and the top carriage frame is configured for coupling to the wafer test magnet.

9. The magnet mounting apparatus of claim 7, further comprising:

a controller configured for actuating the first actuator to move the magnet carriage between the first position and the second position.

10. The magnet mounting apparatus of claim 7, wherein the first actuator comprises a pneumatic cylinder.

11. The magnet mounting apparatus of claim 7, further comprising:
   a second actuator coupled to the magnet carriage and configured to control a displacement of the wafer test magnet along an x-axis; and
   a third actuator coupled to the magnet carriage and configured to control a displacement of the wafer test magnet along a y-axis.

12. The magnet mounting apparatus of claim 11, further comprising:
   a fourth actuator coupled to the magnet carriage and configured to further control a displacement of the wafer test magnet along the z-axis.

13. The magnet mounting apparatus of claim 12, wherein the second, third and fourth actuators comprise stepper motors.

14. A method of testing Magnetic Tunnel Junction (MTJ) devices on Device Under Test (DUT) wafers comprising:
   moving a wafer test magnet coupled to a carriage, using a first actuator coupled between the carriage and a cage, into a first position for testing of a Device Under Test (DUT) wafer;
   moving, using the first actuator, the wafer test magnet into a second position;
   replacing a probe card while the wafer test magnet is in the second position;
   moving, using the first actuator, the wafer test magnet into the first position, after replacing the probe card, for testing of another DUT wafer; and
   guiding, using a set of cage guide rods fixedly coupled between a to and bottom of the cage, the carriage with the coupled wafer test magnet between the first position and the second position, wherein the carriage is moveably coupled to the cage guide rods of the cage.

15. The method according to claim 14, further comprising:
   registering, using the first actuator, the wafer test magnet in the first position, wherein the first position is within a predetermined proximity to a wafer chuck during a setup stage.

16. The method according to claim 15, wherein registering the wafer test magnet in the first position further comprises:
   registering the wafer test magnet along an x-axis for the first position using a second actuator coupled between the carriage and the wafer test magnet;
   registering the wafer test magnet along a y-axis for the first position using a third actuator coupled between the carriage and the wafer test magnet; and
   registering the wafer test magnet along a z-axis for the first position using a fourth actuator between the carriage and the wafer test magnet.

17. The method according to claim 16, wherein,
   the first actuator includes a pneumatic cylinder; and
   the second, third and fourth actuator include stepper motors.

18. The method according to claim 14, wherein the DUT wafers comprise wafers of Magnetic Tunnel Junction (MTJ) devices.

* * * * *